(12) United States Patent
Lanzara et al.

(10) Patent No.: US 9,349,898 B2
(45) Date of Patent: May 24, 2016

(54) OPTICAL SYSTEM PROVIDED WITH ASPHERICAL LENS FOR GENERATING ELECTRICAL ENERGY IN A PHOTOVOLTAIC WAY

(75) Inventors: Giovanni Lanzara, Rome (IT); Gino D'Ovidio, Rome (IT); Francesco Crisi, Rome (IT)

(73) Assignee: SOLERGY INC., Piedmont, CA (US)

( * ) Notice: Subject to any disclaimer, the term of this patent is extended or adjusted under 35 U.S.C. 154(b) by 298 days.

(21) Appl. No.: 13/990,165

(22) PCT Filed: Dec. 1, 2011

(86) PCT No.: PCT/IB2011/055416
§ 371 (c)(1),
(2), (4) Date: Jun. 25, 2013

(87) PCT Pub. No.: WO2012/073218
PCT Pub. Date: Jun. 7, 2012

(65) Prior Publication Data
US 2014/0048136 A1 Feb. 20, 2014

(30) Foreign Application Priority Data
Dec. 2, 2010 (IT) .............................. RM2010A0625

(51) Int. Cl.
*H01L 31/054* (2014.01)
*F24J 2/08* (2006.01)

(52) U.S. Cl.
CPC ............... *H01L 31/0543* (2014.12); *F24J 2/08* (2013.01); *Y02E 10/40* (2013.01); *Y02E 10/52* (2013.01)

(58) Field of Classification Search
CPC ............ H01L 31/0524; H01L 31/0543; H01L 31/052; H01L 31/0522; H01L 31/0525; H01L 31/054–31/0549; Y02E 10/52; Y02E 10/40; F24J 2/067; F24J 2/08
USPC .................................................. 136/243–265
See application file for complete search history.

(56) References Cited

U.S. PATENT DOCUMENTS 4,883,522 A * 11/1989 Hagerty et al. ................ 65/17.6
6,302,100 B1 * 10/2001 Vandenberg .................. 126/698
(Continued)

FOREIGN PATENT DOCUMENTS

WO    WO 2010027083 A1 * 3/2010

*Primary Examiner* — Eli Mekhlin
*Assistant Examiner* — Liesl C Baumann
(74) *Attorney, Agent, or Firm* — Lucas & Mercanti, LLP.

(57) ABSTRACT

Disclosed is an optical system for concentrating effective light the wavelength whereof is comprised between two limit values ($\lambda_i$, $\lambda_s$), comprising: an aspheric lens adapted for receiving and refracting the sunlight and provided with a convex lower portion defining a lower face with curved profile consisting of a predetermined number of curvatures with common tangency points in the contact points between two contiguous curvatures and which therefore provides for different focal points, each one corresponding to a wavelength value of effective light, comprised within the range defined by two focal points ($f_i$, $f_s$) respectively corresponding to said limit values ($\lambda_i$, $\lambda_s$); an optical manifold with tapered shape, internally hollow and provided with an internal reflecting surface; said manifold extending from a larger base, facing said lower portion of the aspheric lens, to a smaller base and being adapted for receiving the effective light therein, focused by said aspheric lens, and for reflecting the effective light portion that does not directly hit the receiving surface interfaced with the smaller base of said optical manifold; and a photovoltaic cell facing the smaller base of the manifold and provided with a predetermined number of respectively superimposed layers, each layer being intended for absorbing light rays of predetermined wavelengths coming from a corresponding capture area of the aspheric lens and/or from the manifold, so as to have on said photovoltaic cell, a distribution of light energy with a predetermined homogeneity level.

11 Claims, 10 Drawing Sheets

(56) References Cited

U.S. PATENT DOCUMENTS

| | | | |
|---|---|---|---|
| 2009/0032102 A1* | 2/2009 | Chen et al. | 136/259 |
| 2009/0114280 A1 | 5/2009 | Jensen | |
| 2009/0185302 A1* | 7/2009 | Forrester | F24J 2/085 359/853 |
| 2009/0223555 A1 | 9/2009 | Ammar | |
| 2009/0277496 A1* | 11/2009 | Khazeni | F24J 2/08 136/246 |
| 2010/0126554 A1* | 5/2010 | Morgan et al. | 136/246 |
| 2010/0212724 A1* | 8/2010 | Wu | 136/252 |
| 2010/0212742 A1* | 8/2010 | Engel et al. | 136/259 |
| 2010/0326494 A1* | 12/2010 | Okamoto | 136/246 |
| 2011/0155243 A1* | 6/2011 | Okamoto | 136/259 |

* cited by examiner (1/4)

(2/4)

(3/4)

(4/4)

OPTICAL SYSTEM PROVIDED WITH ASPHERICAL LENS FOR GENERATING ELECTRICAL ENERGY IN A PHOTOVOLTAIC WAY

CROSS-REFERENCE TO RELATED APPLICATIONS

This application is a 371 of PCT/IB2011/055416, filed Dec. 1, 2011, which claims the benefit of Italian Patent Application No. RM2010A000625, filed Dec. 2, 2010, the contents of each of which are incorporated herein by reference.

FIELD OF THE INVENTION

The present invention relates to an optical system for light concentration, in particular for concentrating and using the energy content of sunlight.

BACKGROUND OF THE INVENTION

The use of solar energy, through photovoltaic, thermal or thermo-photovoltaic technologies, is performed either by exposing a cell receiving directly at the incident sunlight, or concentrating the sunlight with special optical systems before directing it to the respective receiving cell.

The known optical systems may comprise reflecting surfaces and also concentration means that use lenses. Within this context, the need is felt of focusing the amount of effective light, gathered by the optical concentration system, on an active or passive receiving surface, in the most uniform possible manner.

In particular, both within the photovoltaic scope and in the thermal scope, it is preferable to avoid concentration peaks on the receiving surface which may cause thermal stresses and undesired variations in the energy transformation efficiency.

For example, in the photovoltaic scope, square or rectangular cells are used, consisting of sub-cells connected in a series that are set up for using the energy associated to the incident light within a certain wavelength range.

In fact, the efficiency of converting the solar energy into electric energy is also affected by the radiance uniformity besides the operating temperature of the cell: the more the irradiation on the cell is evenly distributed, the higher the energy conversion efficiency.

In the case of sunlight, the effective portion of the energy to be used within a photovoltaic scope in general is comprised between 300 nm and 2000 nm of the wavelength.

Multijunction photovoltaic cells must be used in order to capture all the energy, consisting of multiple layers of superimposed materials, each one sensitive to a predetermined wavelength portion.

These types of photocell can reach the theoretical limit of about 70% conversion efficiency of the solar light energy into electric energy.

Triple cells are currently used which allow obtaining conversion efficiencies even higher than 40%.

Therefore, herein and hereinafter, by effective light it is meant the light portion defined in the wavelength range to be used in order to convert the sunlight energy into electric energy. Such effective light is thus defined by the upper and lower limit values that delimit said range.

In order to obtain good operation of the photocell, for said effective light it is necessary for the radiance on the receiving surface to be as uniform as possible within a predetermined range, avoiding peaks, that is, energy concentrations having excessive density.

Such uniformity must be kept while ensuring an acceptance angle, that is, the deviation from the ideal angle with which the concentrated light beam hits the receiving surface. In the case of a lens with flat surface exposed to the sun, the ideal design incidence angle of the sun rays on the lens surface is 90°; the accepted deviation, defined as acceptance angle, is the one that in any case keeps a conversion efficiency equal to at least 90% of the maximum efficiency. Two fundamental technical aspects need to be addressed to have a good operation of the lens within the acceptance angle limits: the operating accuracy of the designed optical system (lenses, coupling mechanics) and the accuracy of the electromechanical solar tracking system.

At present, the optical systems used for concentration use small sized spherical lenses or more frequently, large sized Fresnel lenses.

These lenses produce various types of optical aberrations, in particular chromatic aberrations due to the variation of the refractive index of the lens material as the wavelength of the effective light captured varies. In particular, with refractive optics, the light with shorter wavelength undergoes a greater deviation, the crossed thickness being equal, compared to light with longer wavelength.

Moreover, spherical lenses, of the Fresnel type too, produce the so-called spherical aberration, that is, the distribution of the focuses of the light beams coming from different regions from the lens on a non accurate area.

These aberrations cause irregularities in the uniformity with which a receiving surface of a cell may be illuminated, causing efficiency losses and can in any case be managed thanks to the relatively small thicknesses of the lenses.

The above problems are quite manageable with usual technologies with systems that use small diameter (100 mm) lenses and small sized photocells; on the other hand, they become insurmountable as the lens size increases, that is, with diameters larger than 200 mm.

In fact, the lens concentration photovoltaic technology has so far used Fresnel lenses that exhibit fewer problems, but in any case introduce many aberrations.

SUMMARY OF THE INVENTION

The technical problem at the basis of the present invention therefore is to provide a lens concentration optical system that allows obviating the drawbacks mentioned above with reference to the prior art, making large sized aspheric lenses usable for photovoltaic applications and thereby:

1) conveying, through a suitable lens curvature profile, the sunlight onto a predefined concentration surface (photovoltaic cell);
2) reducing the optical efficiency loss due to the chromatic and spherical aberration;
3) obtaining, on the concentration surface (photovoltaic cell), an illumination profile (light spot), of predefined size and shape and uniform irradiance;
4) obtaining, on every single layer the multijunction photovoltaic cell is made of, each one sensitive to a predetermined wavelength range, an illumination profile having predefined size and shape besides a uniform irradiance.

Such problem is solved by an optical system that has, at its basis, design and construction criteria that provide for the following steps:

A) definition of the dimensions, shape and uniformity of radiance of the light spot on both the concentration plane and on every single layer of the multijunction cell;

B) definition of the lens geometry, the refractive index being known, on the basis of the dimensions and shape of the light spot on the cell and on the basis of the spectral distribution thereof;

C) definition of the geometry of the reflecting optical conveyor in order to recover as much as possible the optical efficiency losses related to the chromatic aberration phenomenon.

In particular, an optical system (1) for concentrating effective light the wavelength whereof is comprised between two limit values ($\lambda_i$, $\lambda_s$), which is characterized in that it comprises:

an aspheric lens (2) adapted for receiving and refracting the sun rays and provided with a convex lower portion defining a lower face (4) with curved profile consisting of a predetermined number of curvatures with common tangency points in the contact points between two contiguous curvatures and which therefore provides for different focal points, each one corresponding to a wavelength value of effective light, comprised within the range defined by two focal points ($f_i$, $f_s$) corresponding to said limit values ($\lambda_i$, $\lambda_s$) respectively;

an optical manifold (5) with tapered shape, internally hollow and provided with an internal reflecting surface; said manifold (5) extending from a larger base (6), facing said lower portion of the aspheric lens (2), to a smaller base (7) and being adapted for receiving the effective light therein, focused by said aspheric lens (2), and for reflecting the effective light portion that does not directly hit the receiving surface (9) interfaced with the smaller base (7) of said optical manifold (5);

a photovoltaic cell (9) facing the smaller base (7) of the manifold (5) and provided with a predetermined number of respectively superimposed layers, each layer being intended for absorbing light rays of predetermined wavelengths coming from a corresponding capture area of the aspheric lens (2) and/or from the manifold (5), so as to have, in use, on said photovoltaic cell (9), a distribution of light energy with a predetermined homogeneity level.

The main advantage of the optical system designed with the criteria defined by the present invention lies in allowing the conveying of captured light on an active surface of a receiving cell, minimizing the aberrations and obtaining optimal illumination uniformity on a light spot of predefined size and shape.

The devised design technique allows using lenses of any shape for generating electric energy through photovoltaics.

BRIEF DESCRIPTION OF THE DRAWINGS

The present invention shall be described hereinafter according to a preferred embodiment thereof, given by way of a non-limiting example, with reference to the annexed drawings, wherein.

DETAILED DESCRIPTION OF THE INVENTION

Figure 1:
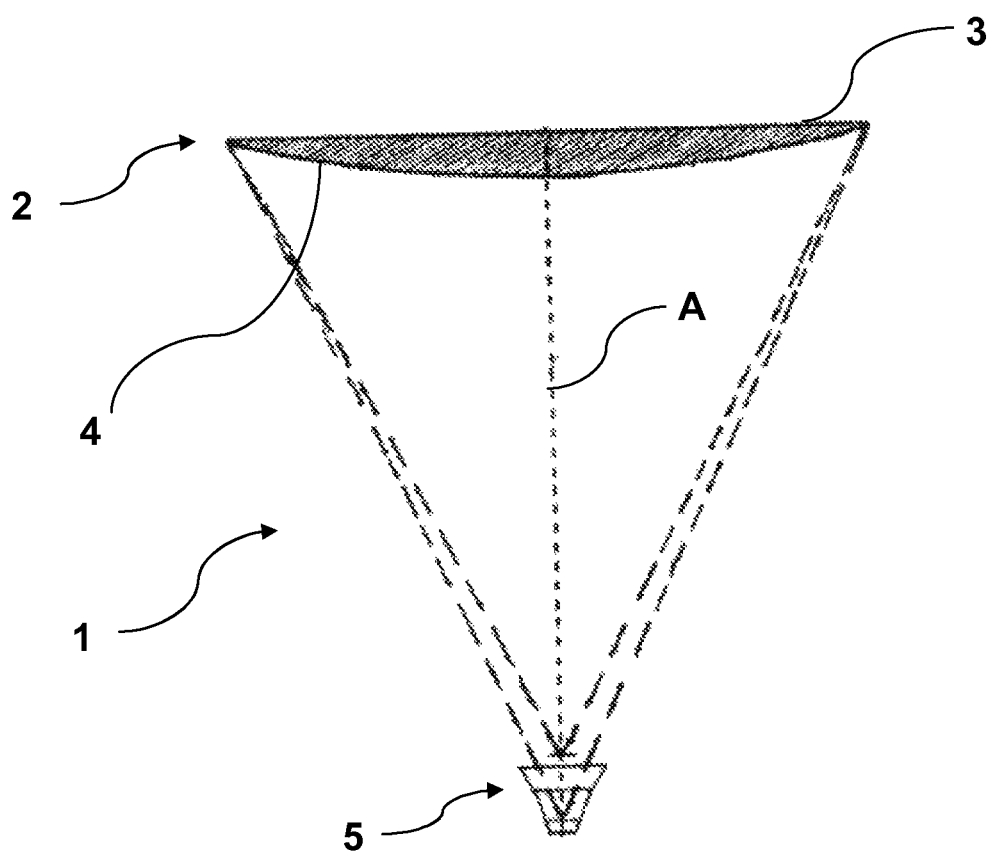
FIG. 1 shows a schematic longitudinal cutaway view of an optical system according to the invention.
Figure 2:
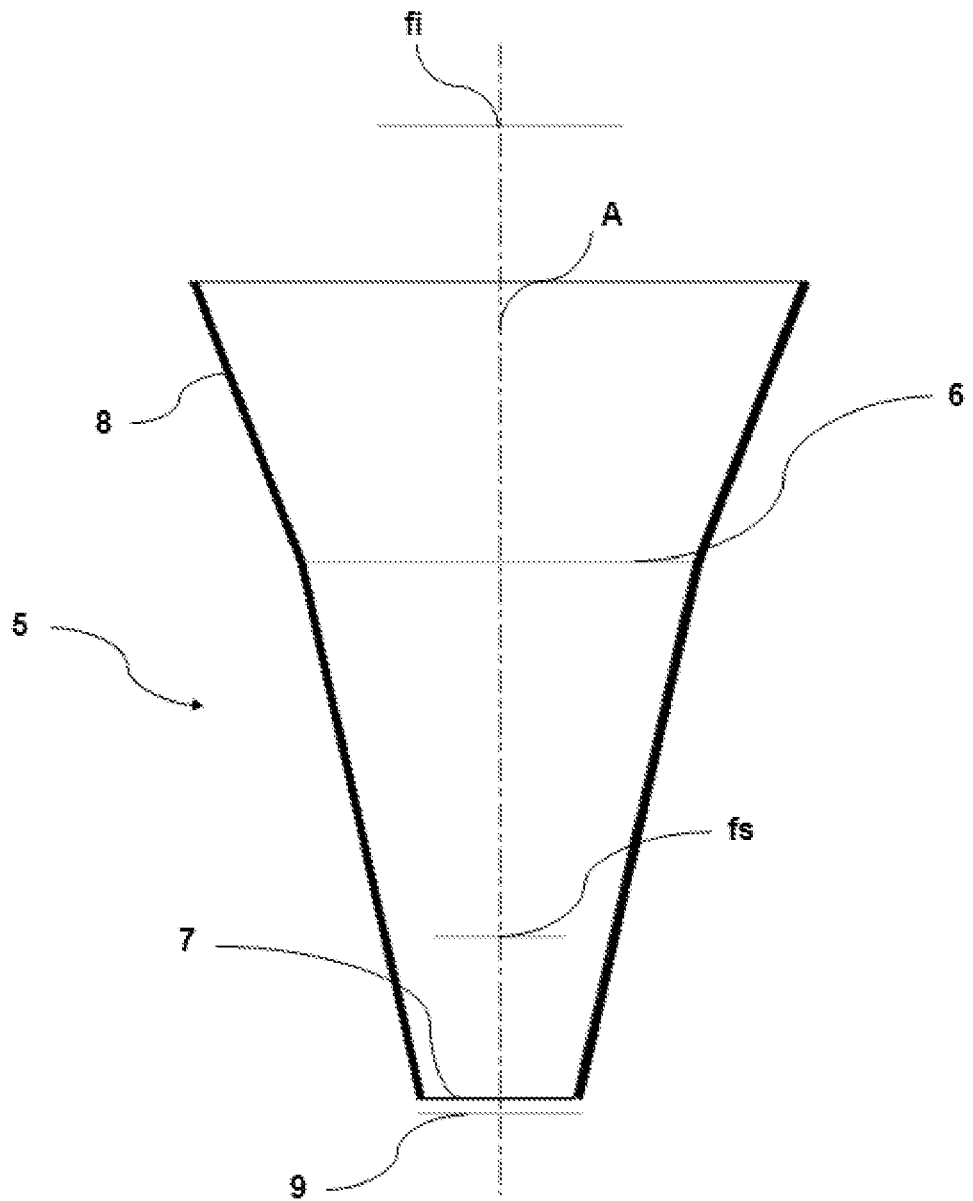
FIG. 2 shows a schematic longitudinal cutaway view of a detail of the system of FIG. 1.

With reference to the figures, an optical system for light concentration, in particular an effective light portion of the sunlight as defined above, is globally indicated with reference numeral 1.

The wavelength range that defines said effective light portion is delimited by a shorter wavelength $\lambda_i$ and by a longer wavelength $\lambda_s$. By way of an indication only, they may be $\lambda_i$=400 nm and $\lambda_s$=1800 nm.

It comprises a lens 2, preferably having a circular cross section, which exhibits a first upper face 3 with preferably flat profile exposed to the light source, that is, the sun, and defining the capture surface of the concentration system 1.

Lens 2 further comprises a convex lower portion defining a lower surface, or face 4 with curved profile opposite to the upper face 3.

In any case, lens 2 may also have other optical shapes such as for example: biconvex or concave-convex.

In the optical system according to the invention, lens 2 is an aspheric lens in the effective light portion range, with the convex curved surface 4 designed so as to eliminate, for said range, any aberration of the spherical type, based on the well-known Snell's law.

Therefore, considering the limit values of said range, the shorter wavelength $\lambda_i$ corresponds to a first limit focal point $f_i$ and the longer wavelength $\lambda_s$ corresponds to a second limit focal point $f_s$, both arranged along a focal axis A of lens 2. The two limit focal points therefore define a path of the light refracted by lens 2.

Due to the chromatic aberration, the first limit focal point $f_i$ and the second limit focal point $f_s$ are spaced apart on the focal axis A by a distance that depends on the limit values, which for the limit values mentioned above is about 50 mm.

The focal point of light radiations with an intermediate wavelength between 400 and 1800 nm will be in a focal point comprised between the first and the second focal point.

The design of the convex surface of the aspheric lens 2, in the case of plane-convex lens, takes place as described hereinafter.

The process for matching the lens and the cell surfaces is described hereinafter; for other lens shapes, the analytical procedure is similar.

Seen from the top, the projection of the convex surface of the lens, in the case of circular shape, is described by a circle, as well as the opposite flat surface. It is divided into concentric areas having the same width, obtaining areas $A_1$-$A_n$.

Subsequently, the surface of the receiving cell is divided into circular areas (rings) with areas $a_1$-$a_n$ proportional to those of the lens, so that the entire projection of the lens area is included within the cell area.

Then, with a ray tracing process, the rays that join ring $A_n$ on the lens to the corresponding ring an thereof on the cell are traced.

A limit wavelength $\lambda_i$ is defined, corresponding to a refractive index $n_i$. The corresponding ray will hit the external surface 3 of the lens, crossing the same up to intersect the curved surface 4 with a certain angle $\alpha_{i1}$-$\alpha_{i2}$ the value whereof, to be determined, will correspond to the normal to the tangent of the surface in that point. Said ray incident on the curved surface of the lens, continuing its path, will undergo a refraction in the second curved interface and will aim to the corresponding point on the cell. Knowing the refraction index of the material that makes up the lens and using Snell's law for refraction, it is possible to obtain the lens curvature with the following process. The output angle from the curved interface, compared to the normal to the surface, has a value $\alpha_{u1}$ and $\alpha_{u2}$. Said values correspond to incident radiuses perpendicular to the internal and external margins of any one of the rings, or concentric areas, in which the lens circle is divided.

The aberration phenomenon is controlled, where required, by performing variations of the focal distances as the distance of the incident light ray relative to the centre of the lens varies, imposing a focal length in that point by a predetermined wavelength, such as to direct the ray refracted by the lens directly onto the photocell or the optical manifold (secondary optics). The procedure described above, applied to all the lens points by the effective light wavelength range, allows obtaining a homogeneous energy distribution on the receiver (photovoltaic cell).

By way of an example, in the case of a circular and plane-convex lens, the calculation process is described below which is similar for other geometrical shapes of the lens.

It is assumed that the lens generatrix curve consists of a series of predetermined curve portions as described above. In the case of representing the curve with second degree equation of the type:

$y=ax^2+bx+c$ (parabolic profile of the convex surface), the following procedure is performed.

Three conditions must be imposed to determine the coefficients (a, b, c) of the equations of the single curve portions:

Two conditions on the continuity of the tangents; tangent to the curve of the previous portion equal to the tangent to the curve of the subsequent portion, for the initial and final point of the single portion being examined;

A condition of continuity of the curve; initial point of the curve coincident with the final point of the previous curve portion.

Analytically, the tangent to the curve in a point is obtained with the derivative of the function calculated in point:

$dy/dx=2ax+b$

The inclination angles of the tangents to the curve in the initial and final points are obtained from the following relations:

$\beta_1 = \arctan((x_1-x_{1'})/(y_1-y_{1'}))$ $\beta_2 = \arctan((x_2-x_{2'})/(y_2-y_{2'}))$ With Snell's law, the relation that links angles $\alpha$ and $\beta$ is obtained;

$n_v \cdot \sin \theta_{i1} = n_a \sin \theta_{u1}$ $\theta_{i1} = \alpha_1$ $\theta_{u1} = \alpha_1 + \beta_1$ Therefore, the three conditions to be imposed for determining the coefficients of equations (a, b, c) of the curve portions may be summarized in the following system of three linear equations:

$$\begin{cases} (dy/dx)_{x=x1} = \tan\alpha_1 \\ (dy/dx)_{x=x2} = \tan\alpha_2 \\ y(x-x_1) = y_1 \end{cases}$$

-continued $$\begin{cases} 2ax_1 + b = \tan\alpha_1 \\ 2ax_2 + b = \tan\alpha_2 \\ ax_1^2 + bx_1 + c = y_1 \end{cases}$$

At this point, the sequence is repeated along an entire lens radius; the circular symmetry of the lens allows quickly reconstructing the total curvature of the convex portion of the lens.

The resulting curvature, due to its geometrical construction, will exhibit no spherical aberration phenomena.

Since the lens is circular, also the concentrated light beam will be circular, in particular it will have a substantially conical shape which however, must hit a cell that is generally made with a different shape, in particular square or rectangular.

The condition to impose for having a uniform irradiance is the bi-univocal matching between the lens areas and the corresponding cell areas. In this way, the irradiation distribution on the cell will correspond to the irradiation distribution on the lens.

On said refracted light path, the optical system 1 comprises a truncated-pyramid optical manifold (considering in this case a square receiver-photocell), positioned for intercepting the light beam of the effective light portion refracted by the aspheric lens 2.

Manifold 5 extends from a larger base 6 to a smaller base 7; the larger base 6 faces said lower portion of the aspheric lens 2 and, as the smaller base 7 thereof, it is substantially perpendicular to the focal axis A thereof, which constitutes the longitudinal symmetry axis thereof.

Therefore, manifold 5 is arranged so as to be adapted for receiving the effective light therein, focused or refracted by said aspheric lens 2.

Above the larger base 6, manifold 5 further comprises a truncated-pyramid inlet 8 with an opening, namely an inclination, that is greater than that of manifold 5.

The truncated-pyramid manifold 5 is internally hollow and exhibits an internal surface that reflects said refracted effective light so as to direct it towards the smaller base 7.

Right underneath or in any case at the smaller base 7, a multijunction or multilayer receiving cell 9 may be positioned, provided with a preferably square receiving surface and comprising respectively superimposed layers, preferably three, intended for absorbing light rays having predetermined wavelengths coming from the aspheric lens 2 and/or from manifold 5.

Advantageously, the truncated-pyramid manifold 5 exhibits sections, perpendicular to said longitudinal symmetry axis, which are square or rectangular or have a shape geometrically similar to that of the receiving surface of cell 9.

In the present example of the optical system 1, the first limit focal point $f_i$ corresponding to the effective light that exhibits a wavelength equal to the lower limit value $\lambda_i$, is positioned between the aspheric lens 2 and the larger base 6 of manifold 5.

The second limit focal point $f_s$ corresponding to the effective light that exhibits a wavelength equal to the higher limit value $\lambda_s$, is on the other hand positioned within manifold 5.

In general, the height of manifold 5 is such so that the entire effective light portion refracted by the aspheric lens 2 illuminates said internal reflecting surface of the same manifold 5.

Preferably, all the light reflected by the internal reflecting surface of the truncated-pyramid manifold 5 is directed on an area that corresponds to the smaller base 7 of said manifold, in the practice making the effective light be reflected by the internal surface of manifold 5 only once before being directed towards the smaller base 7.

The inclination of the walls of manifold 5 and the position thereof relative to the aspheric lens 2 are such as to achieve the conveying of the light on receiver 9 with a predetermined maximum tolerance that defines the acceptance angle of the system.

In the light of the features described above and of the above considerations, on the one side the proposed solution allows squaring the shape of the light spot obtained by the optical concentration system and on the other one, through suitable reflections, it allows returning the rays of different wavelength to the same focal plane, preventing dangerous local light concentrations.

The process for matching the lens and the cell surfaces is described hereinafter.

Figure 3:
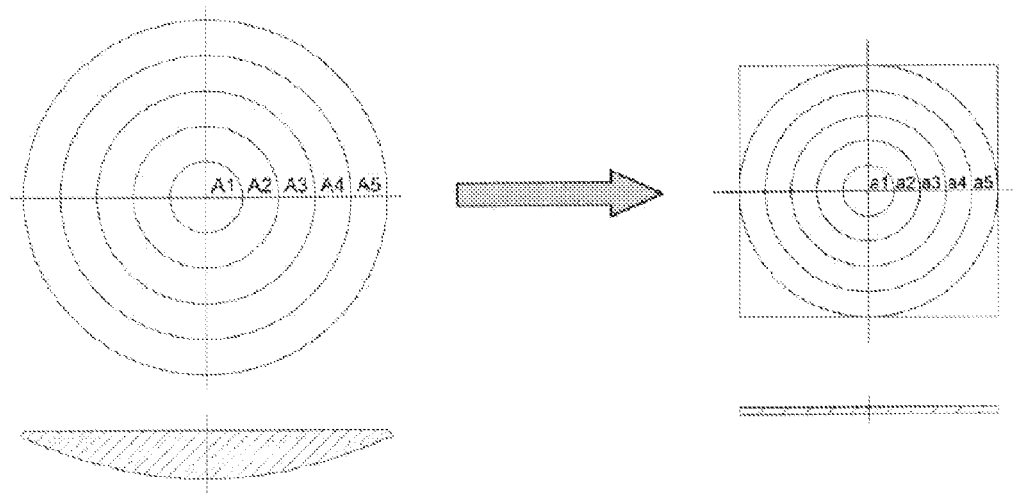
FIG. 3 relates to the process for matching the lens surfaces and the cell surfaces.

The plane surface of the lens is divided into circular rings with areas "$A_1$-$A_n$" (see FIG. 3).

After that, the cell surface is divided into circular rings with areas "$a_1$-$a_n$" proportional to those of the lens, so that the entire projection of the lens area is included within the cell area (see FIG. 3).

Then, with a ray tracing process, the rays that join ring $A_n$ on the lens to the corresponding ring $a_n$ thereof on the cell are traced.

A limit wavelength $\lambda_{0,4}$ is defined, corresponding to a refractive index $n_{0,4}$.

The corresponding ray will hit the plane surface of the lens, crossing the same up to intersect the curved surface with a certain angle the value whereof, to be determined, will correspond to the normal to the tangent of the surface in that point.

Figure 4:
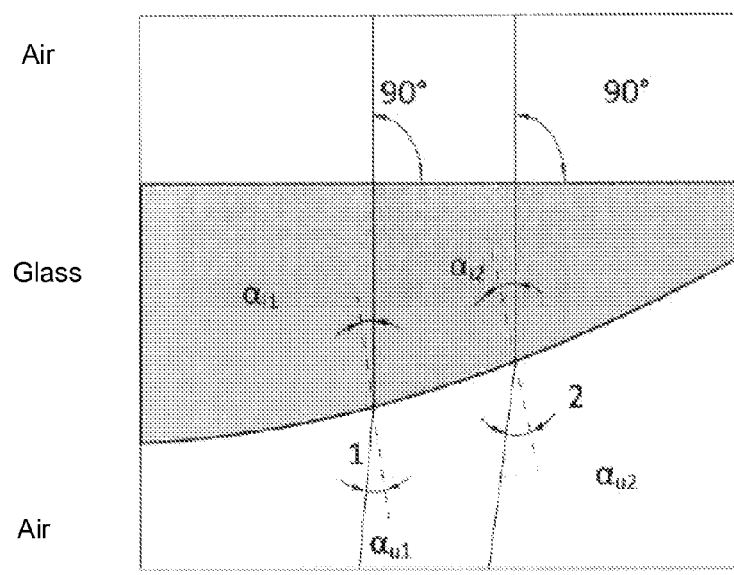
FIG. 4 shows a generic portion of curve 1-2 of the lens generatrix.

Said ray incident on the curved surface of the lens, continuing its path, will undergo a refraction in the second glass-lens interface and will aim to the corresponding point on the cell (see FIG. 4).

Figure 5:
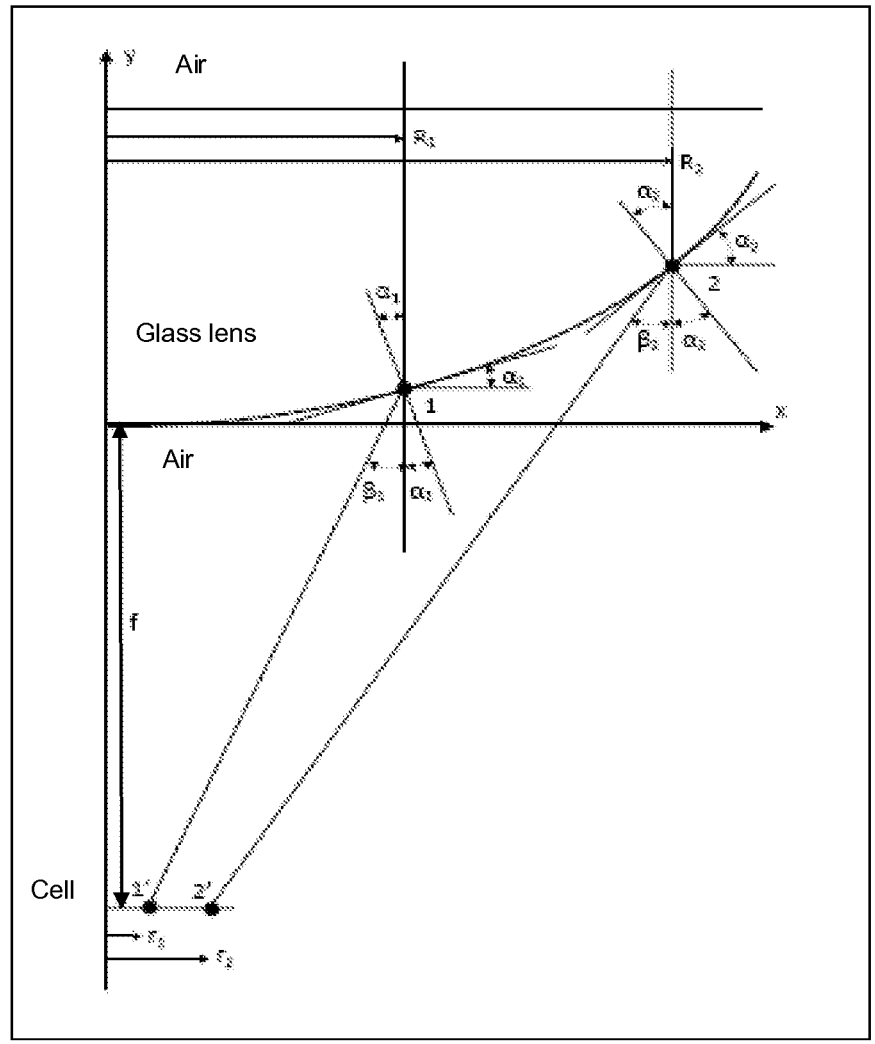
FIG. 5 relates al process for obtaining the lens curvature.

Knowing the refraction index of the glass and using Snell's law for refraction, it is possible to obtain the lens curvature with the following process (see FIG. 5).

It is assumed that the mirror generatrix curve consists of a series of predetermined curve portions with second degree equation of the type:

$$y=ax^2+bx+c$$

Three conditions must be imposed to determine the coefficients (a, b, c) of the equations of the single curve portions:
  two conditions on the continuity of the tangents; tangent to the curve of the previous portion equal to the tangent to the curve of the subsequent portion, for the initial and final point of the single portion being examined;
  a condition of continuity of the curve; initial point of the curve coincident with the final point of the previous curve portion.

Analytically, the tangent to the curve in a point is obtained with the derivative of the function calculated in point:

$$dy/dx=2ax+b$$

The inclination angles of the tangents to the curve in the initial and final points are obtained from the following relations:

$$\beta 1=\arctan((x_1-x_{1'})/(y_1-y_{1'}))$$

$$\beta 2=\arctan((x_2-x_{2'})/(y_2-y_{2'}))$$

With Snell's law, the relation that links angles α and β is obtained:

$$n_v \cdot \sin \theta_{i1} = n_a \cdot \sin \theta_{u1}$$

$$\theta_{i1} = \alpha_1$$

$$\theta_{u1} = \alpha_1 + \beta_1$$

Therefore, the three conditions to be imposed for determining the coefficients of equations (a, b, c) of the curve portions may be summarized in the following system of three linear equations:

$$\begin{cases} (dy/dx)_{x=x1} = \tan\alpha_1 \\ (dy/dx)_{x=x2} = \tan\alpha_2 \\ y(x-x_1) = y_1 \end{cases}$$

$$\begin{cases} 2ax_1 + b = \tan\alpha_1 \\ 2ax_2 + b = \tan\alpha_2 \\ ax_1^2 + bx_1 + c = y_1 \end{cases}$$

At this point, the sequence is repeated along an entire lens radius; the circular symmetry of the lens allows quickly constructing the total curvature of the convex portion of the lens.

The resulting curvature, due to its geometrical construction, will exhibit no spherical aberration phenomena.

Figure 6:
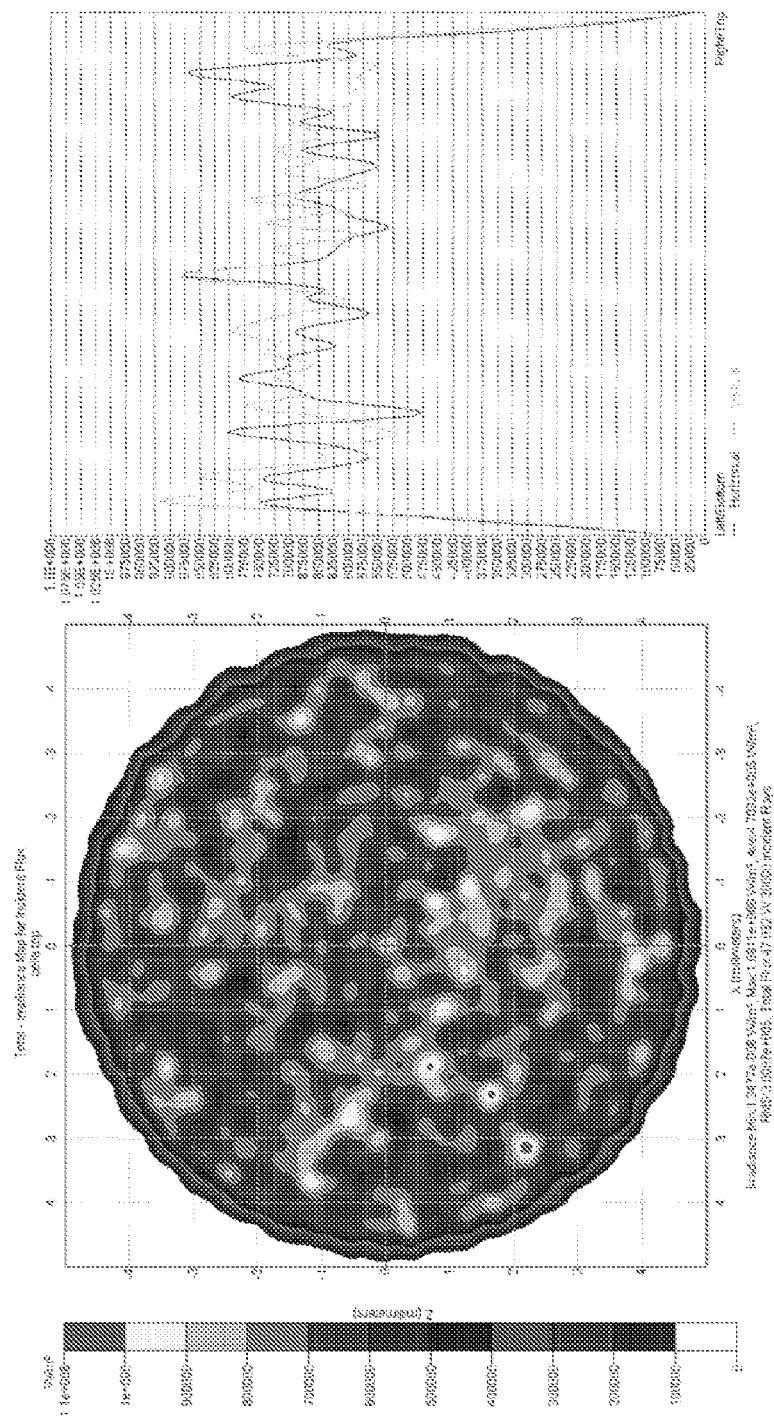
FIG. 6 shows the uniform irradiation profile on the cell equivalent surface.

The result may be seen in FIG. 6 which shows the extreme uniformity of the irradiation profile on the equivalent cell surface.

The solution proposed so far, however, exhibits the following two drawbacks:
  the cell surface is not completely covered by the irradiation;
  chromatic aberration.

As regards the total coverage of the cell area, since the lens is circular and the cell is square, any solution found (beam inscribed within the cell or circumscribed beam) using a single optics will in any case give rise to losses. It is therefore necessary to introduce an optical device between lens and cell at the input whereof the beam arrives circular-wise from the lens, and at the output whereof it comes out square and with the same size as the cell.

With reference to the chromatic aberration, on the other hand, repeating the process for determining the curvature for the last wavelength $\lambda_{1,8}$ of the system usage band, it is found that the curvatures corresponding to the two extreme wavelengths do not match.

The problem is due to the bandwidth that prevents having an optimized curvature for the entire band.

Figure 7:
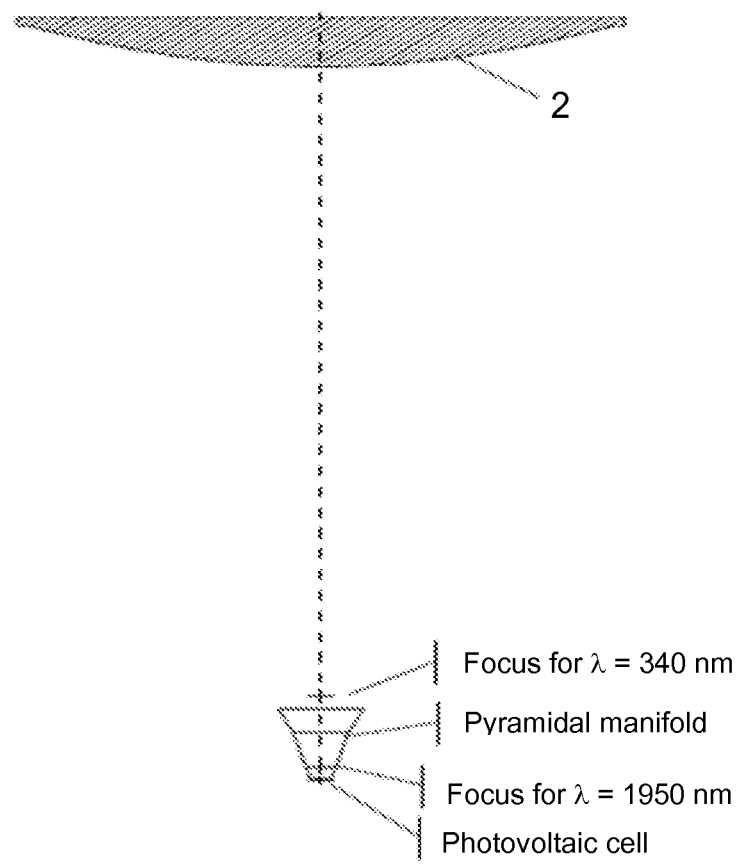
FIG. 7 shows the positions of the two focuses corresponding to particular wavelength values.

For example, selecting an intermediate wavelength in the band and proceeding with determining the optimal curvature for ensuring uniformity, it is obtained that the two focuses corresponding to $\lambda_{0,4}$ and to $\lambda_{1,8}$ will be spaced apart by about 50 mm (see FIG. 7).

The solution to both problems therefore is to introduce a truncated-pyramid reflecting manifold that carries out the two functions, on the one end squaring the shape of the light spot, on the other one, through suitable reflections, returning the rays at different wavelengths to the same focal plane, preventing dangerous local light concentrations.

Figure 8:
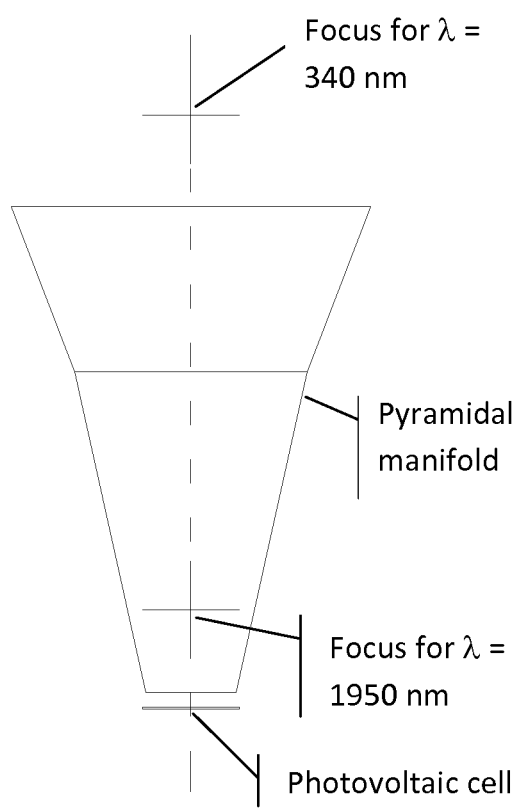
FIG. 8 shows the assembly consisting of the truncated-pyramid manifold and of the cell, and the illumination profiles calculated on three bands corresponding to the absorption bands of the three junctions of a triple junction cell.
Figure 8:
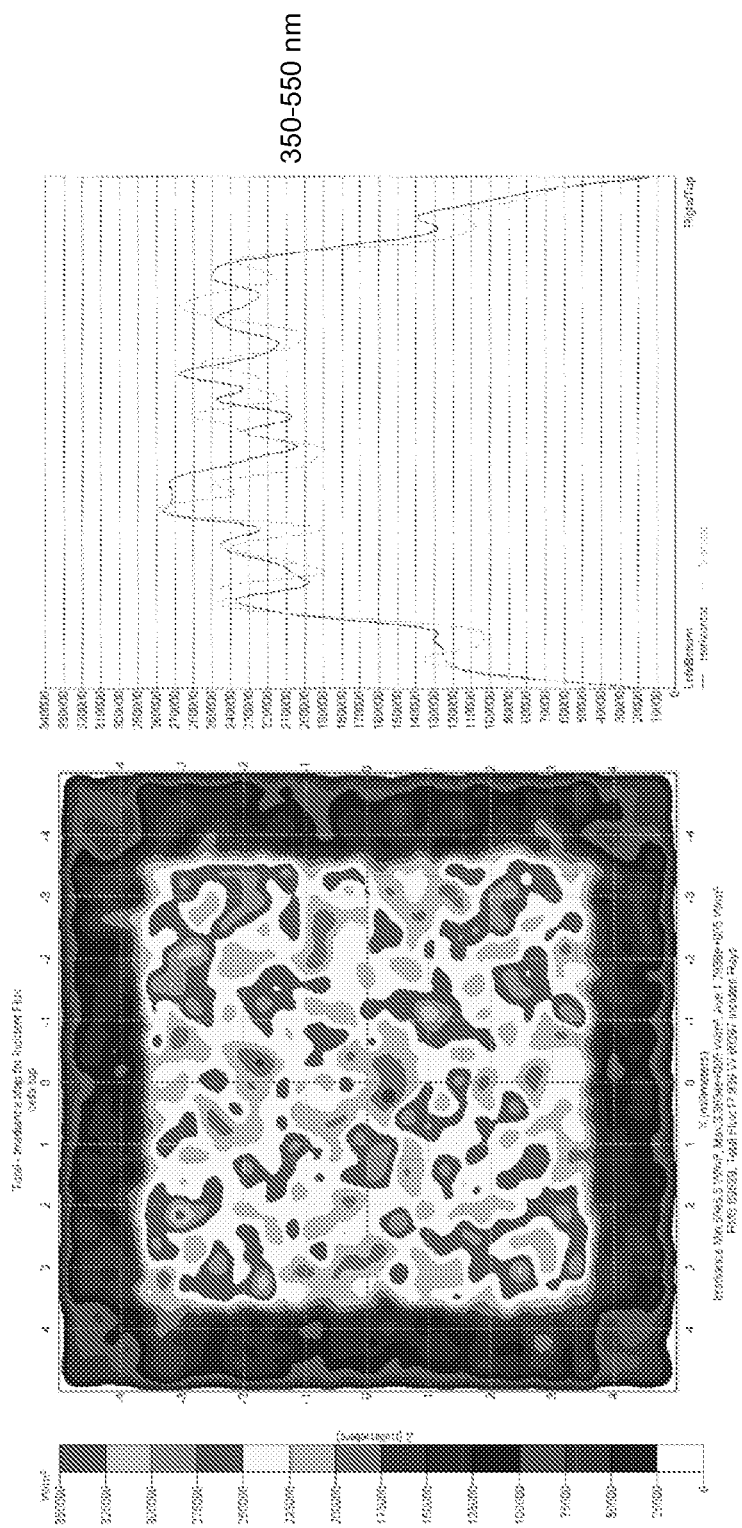
Figure 8:
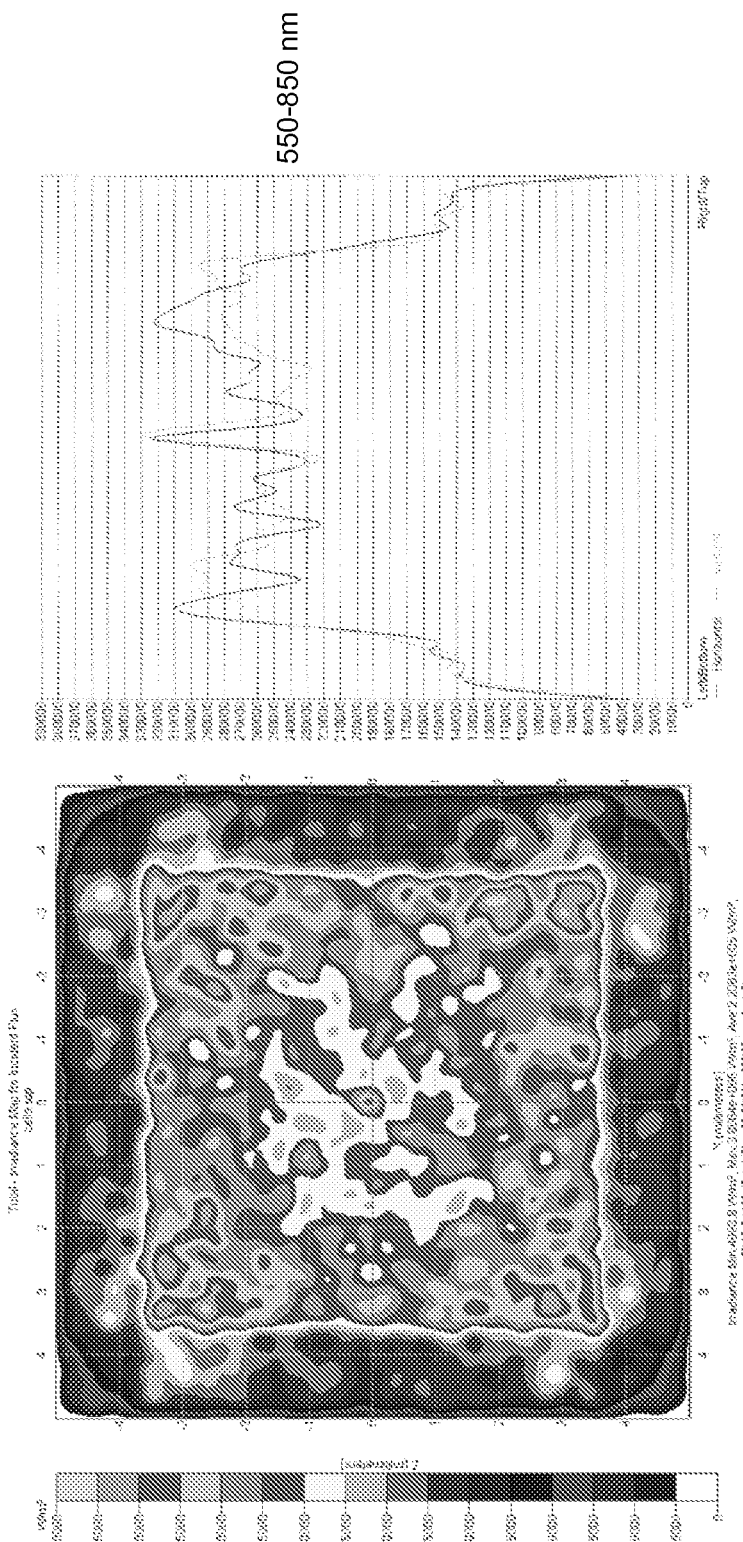
Figure 8:
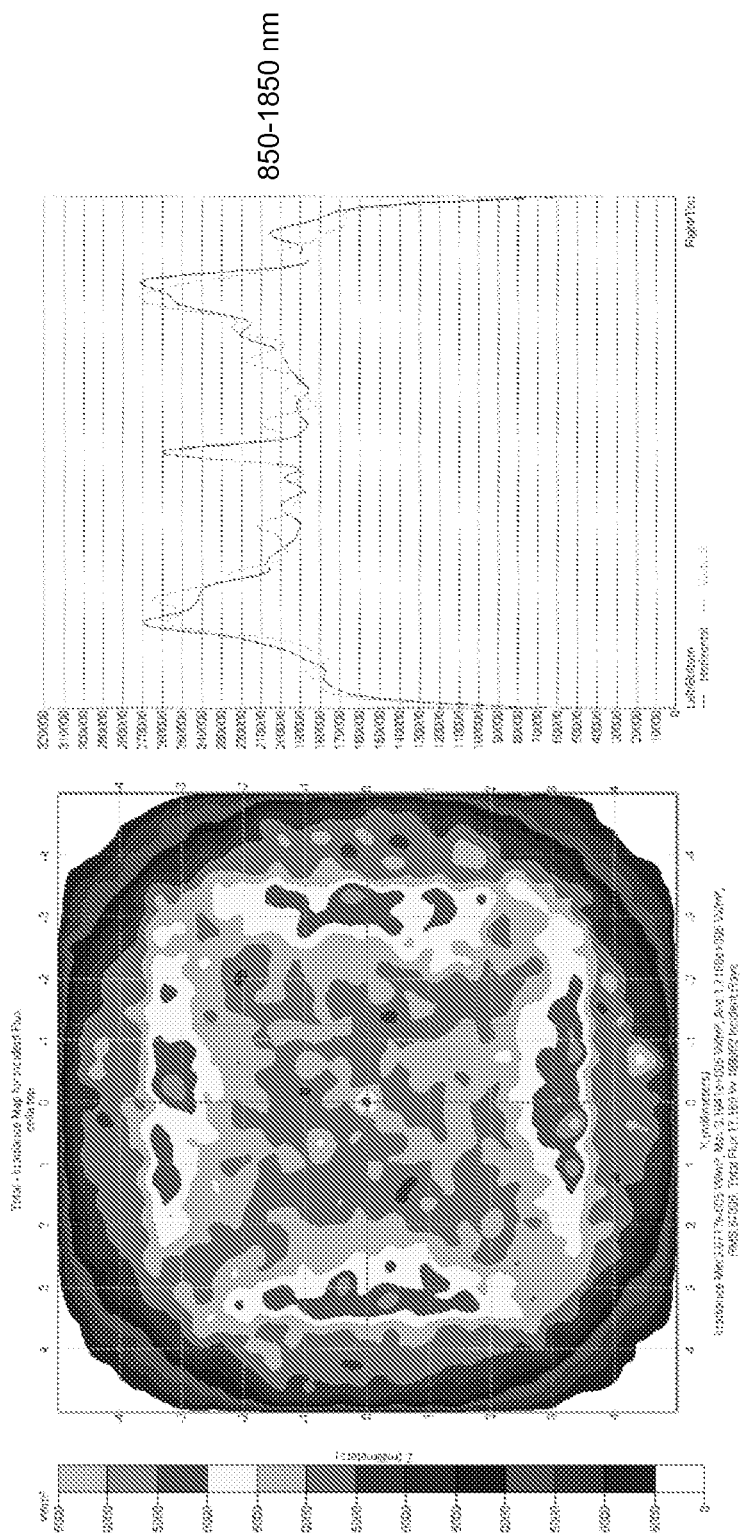

The effect on the light profile hitting the cell is well visible in FIG. 8, which shows the drawing of a truncated-pyramid manifold and the illumination profiles calculated on three bands corresponding to the absorption bands of the three junctions making up the triple junction cell.

As it can be seen in the annexed figures, the optical system proposed herein has the following properties:
- it allows producing a square illumination profile on the cell;
- it allows producing a uniform illumination profile on the cell, preventing dangerous intensity peaks;
- it is free from spherical aberration;
- it is free from chromatic aberration.

According to further embodiments of the present invention, manifold 5 may have a truncated-cone or conical-pyramid, or in any case tapered shape.

The optical system described above therefore allows producing a square illumination profile on the cell or in any case of any other shape; it allows obtaining a uniform and homogeneous illumination profile on the cell, preventing dangerous intensity peaks; all avoiding or minimizing any spherical and/or chromatic aberration phenomena.

It is clear that a man skilled in the art may make several further changes and variations to the optical system described above in order to meet further and incidental needs, all falling within the scope of protection of the present invention as defined by the annexed claims.

The invention claimed is:

1. An optical system for concentrating effective light the wavelength whereof is comprised between a lower limit value ($\lambda_i$) and a higher limit value ($\lambda_s$), comprising:
    an aspheric lens adapted for receiving and refracting the effective light and provided with a convex lower portion defining a lower face with a generatrix curve having a curved profile consisting of a series of predetermined parabolic curved portions providing different focal points, each one corresponding to a wavelength value of effective light, comprised within the range defined by a lower limit focal point ($f_i$) and a higher limit focal point ($f_s$) corresponding to said lower limit value ($\lambda_i$) and said higher limit value ($\lambda_s$) respectively, wherein each adjacent pair of curved portions in the series of predetermined parabolic curved portions have common tangency points such that a tangent at a final point of a previous curved portion of the series of predetermined parabolic curved portions is equal to a tangent at an initial point of a subsequent curved portion of the series of predetermined parabolic curved portions, and there is a continuity of the curved profile such that the initial point of the subsequent curved portion and the final point of the previous curved portion are coincident;
    an optical manifold with a tapered shape, internally hollow and provided with an internal reflecting surface; said manifold extending from a larger base, facing said convex lower portion of the aspheric lens, to a smaller base and being adapted for receiving the effective light therein, focused by said aspheric lens, and for reflecting the effective light portion that does not directly hit the receiving surface interfaced with the smaller base of said optical manifold; and
    a photovoltaic cell facing the smaller base of the manifold and provided with a predetermined number of respectively superimposed layers, each layer being intended for absorbing light rays of predetermined wavelengths coming from a corresponding capture area of the aspheric lens and/or from the manifold, so as to have, in use, on said photovoltaic cell, a distribution of light energy with a predetermined homogeneity level.

2. The optical system according to claim 1, wherein the lower limit focal point ($f_i$) corresponding to the effective light that exhibits a wavelength equal to the lower limit value ($\lambda_i$) is positioned between the aspheric lens and the larger base of the manifold.

3. The optical system according to claim 1, wherein the higher limit focal point ($f_s$) corresponding to the effective light that exhibits a wavelength equal to the higher limit value ($\lambda_s$) is positioned within the manifold.

4. The optical system according to claim 1, wherein all the effective light refracted by the aspheric lens illuminates said internal reflecting surface or the manifold.

5. The optical system according to claim 1, wherein all the light reflected by the internal reflecting surface of the manifold is directed on an area that corresponds to the smaller base of the manifold.

6. The optical system according to claim 1, wherein the manifold has a truncated-pyramid or truncated-cone or conical-pyramid shape.

7. The optical system according to claim 6, further comprising a tapered inlet extending from a first opening to a second opening, wherein the second opening is connected to the larger base of the manifold, the first opening facing the aspheric lens being greater than the larger base of the manifold.

8. The optical system according to claim 1, wherein the aspheric lens exhibits an upper face with a flat profile and which is opposite to said lower face.

9. The optical system according to claim 1, wherein the aspheric lens has a circular cross section.

10. The optical system according to claim 1, wherein the photovoltaic cell has a square shape.

11. The optical system according to claim 1, wherein said predetermined number of layers of the photovoltaic cell is greater than two.

\* \* \* \* \*